(12) United States Patent
Kawasaki

(10) Patent No.: US 9,281,474 B2
(45) Date of Patent: Mar. 8, 2016

(54) VARIABLE RESISTANCE MEMORY AND METHOD OF MANUFACTURING THE SAME

(71) Applicant: KABUSHIKI KAISHA TOSHIBA, Tokyo (JP)

(72) Inventor: Hirohisa Kawasaki, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 224 days.

(21) Appl. No.: 13/952,220

(22) Filed: Jul. 26, 2013

(65) Prior Publication Data

US 2013/0313508 A1 Nov. 28, 2013

Related U.S. Application Data

(63) Continuation of application No. PCT/JP2012/059429, filed on Mar. 30, 2012.

(30) Foreign Application Priority Data

Aug. 9, 2011 (JP) ................................. 2011-173966
Mar. 8, 2012 (WO) .................. PCT/JP2012/056609

(51) Int. Cl.
*H01L 47/00* (2006.01)
*H01L 45/00* (2006.01)
*H01L 27/24* (2006.01)

(52) U.S. Cl.
CPC ............ *H01L 45/12* (2013.01); *H01L 27/2472* (2013.01); *H01L 27/2481* (2013.01);
(Continued)

(58) Field of Classification Search
CPC ............ H01L 27/2481; H01L 27/2409; H01L 27/2472; H01L 45/1233; H01L 45/146
See application file for complete search history.

(56) References Cited

U.S. PATENT DOCUMENTS 7,087,919 B2   8/2006   Campbell et al.
7,151,273 B2   12/2006  Campbell et al.
(Continued)

FOREIGN PATENT DOCUMENTS

JP     2010-141046    6/2010
TW      200908295 A   2/2009
(Continued)

OTHER PUBLICATIONS

Japanese Office Action issued Oct. 8, 2013, in Japan Patent Application No. 2011-173966 (with English translation).
(Continued)

*Primary Examiner* — Zandra Smith
*Assistant Examiner* — John M Parker
(74) *Attorney, Agent, or Firm* — Oblon, McClelland, Maier & Neustadt, L.L.P.

(57) ABSTRACT

A variable resistance memory according to an embodiment includes: a first wiring; a second wiring provided above the first wiring and intersecting with the first wiring; a third wiring provided above the second wiring and intersecting with the second wiring; a first variable resistance element provided in an intersection region between the first wiring and the second wiring, the first variable resistance element including a first variable resistance layer formed on the first wiring, and an ion source electrode provided on the first variable resistance layer and penetrating through the second wiring, the ion source electrode being connected to the second wiring and including metal atoms; and a second variable resistance element provided in an intersection region between the second wiring and the third wiring, the second variable resistance element including a second variable resistance layer formed on the ion source electrode.

10 Claims, 14 Drawing Sheets

(52) U.S. Cl.
CPC .......... *H01L45/085* (2013.01); *H01L 45/1233* (2013.01); *H01L 45/1266* (2013.01); *H01L 45/145* (2013.01); *H01L 45/146* (2013.01); *H01L 45/16* (2013.01); *H01L 45/1675* (2013.01)

(56) References Cited

U.S. PATENT DOCUMENTS

| | | |
|---|---|---|
| 7,271,081 B2 | 9/2007 | Li et al. |
| 7,303,971 B2 | 12/2007 | Hsu et al. |
| 7,382,647 B1 | 6/2008 | Gopalakrishnan |
| 7,446,010 B2 | 11/2008 | Li et al. |
| 7,608,514 B2 | 10/2009 | Hsu et al. |
| 7,633,108 B2 | 12/2009 | Li et al. |
| 7,646,007 B2 | 1/2010 | Campbell et al. |
| 7,723,713 B2 | 5/2010 | Campbell et al. |
| 7,968,419 B2 | 6/2011 | Li et al. |
| 8,071,972 B2 | 12/2011 | Lu et al. |
| 8,080,816 B2 | 12/2011 | Campbell et al. |
| 8,116,116 B2 | 2/2012 | Hwang et al. |
| 8,203,873 B2 | 6/2012 | Gopalakrishnan |
| 8,263,958 B2 | 9/2012 | Campbell et al. |
| 2005/0226062 A1 | 10/2005 | Aratani et al. |
| 2007/0015348 A1 | 1/2007 | Hsu et al. |
| 2007/0139987 A1* | 6/2007 | Kouchiyama et al. ............ 365/1 |
| 2009/0014707 A1 | 1/2009 | Lu et al. |
| 2009/0184305 A1* | 7/2009 | Lee et al. .......................... 257/2 |
| 2009/0242868 A1 | 10/2009 | Kurotsuchi et al. |
| 2009/0261315 A1* | 10/2009 | Toda et al. ........................ 257/5 |
| 2010/0085798 A1 | 4/2010 | Lu et al. |
| 2010/0102290 A1 | 4/2010 | Lu et al. |
| 2010/0172170 A1 | 7/2010 | Tamai et al. |
| 2010/0237311 A1* | 9/2010 | Okajima .......................... 257/2 |
| 2011/0272664 A1 | 11/2011 | Tada et al. |
| 2012/0068141 A1 | 3/2012 | Campbell et al. |
| 2012/0243291 A1 | 9/2012 | Gopalakrishnan |

FOREIGN PATENT DOCUMENTS

| | | |
|---|---|---|
| WO | 2010/042732 A2 | 4/2010 |
| WO | 2010/048127 A2 | 4/2010 |
| WO | 2010/079816 A1 | 7/2010 |

OTHER PUBLICATIONS

International Search Report mailed May 15, 2012 for PCT/JP2012/059429 filed on Mar. 30, 2012 in English.

Sung Hyun Jo and Wei Lu, "CMOS Compatible Nanoscale Nonvolatile Resistance Switching Memory", Nano Letters vol. 8 No. 2, pp. 392-397, Jan. 11, 2008.

Combined Taiwanese Office Action and Search Report issued Jul. 16, 2014 in Patent Application No. 101108451 (with English language translation).

* cited by examiner (a)

(b)

(a)

(b)

(a)

(b)

(a)

(b)

(a)

(b)

(a)

(b)

(a)

(b)

VARIABLE RESISTANCE MEMORY AND METHOD OF MANUFACTURING THE SAME

CROSS-REFERENCE TO RELATED APPLICATION

This application is a continuation of PCT/JP2012/059429 filed on Mar. 30, 2012 in Japan and claims the benefit of priority from prior Japanese Patent Application No. 2011-173966 filed on Aug. 9, 2011, PCT/JP2012/056609 filed on Mar. 8, 2012, and PCT/JP2012/059429 filed on Mar. 30, 2012, the entire contents of which are incorporated herein by reference.

FIELD

Embodiments described herein relate generally to variable resistance memories and methods of manufacturing the variable resistance memories.

BACKGROUND

A variable resistance memory is a memory in which two-terminal variable resistance elements each having a variable resistance layer interposed between two electrodes are used as memory elements. In such a variable resistance memory, information writing and erasing are performed by using reversible changes in a variable resistance layer between a high-resistance state and a low-resistance state due to the history of voltage application between the electrodes. Even if the voltage between the two electrodes is cut off, the resistance state of the variable resistance layer is maintained. Accordingly, variable resistance memory is a type of non-volatile memory.

Variable resistance elements are classified into several types based on the types of variable resistance layers and electrodes. For example, there are redox variable resistance elements that utilize movement of oxygen defects of transition metal oxides, ion-conducting variable resistance elements that utilize movement of metal ions or the like in the variable resistance layers.

For example, there are known ion-conducting variable resistance elements in which a thin amorphous silicon film is formed as a variable resistance layer on a silicon substrate doped at high concentration, and an ion source electrode having a metal ion source that can move in the variable resistance layer is formed on the variable resistance layer.

DETAILED DESCRIPTION

Figure 1:
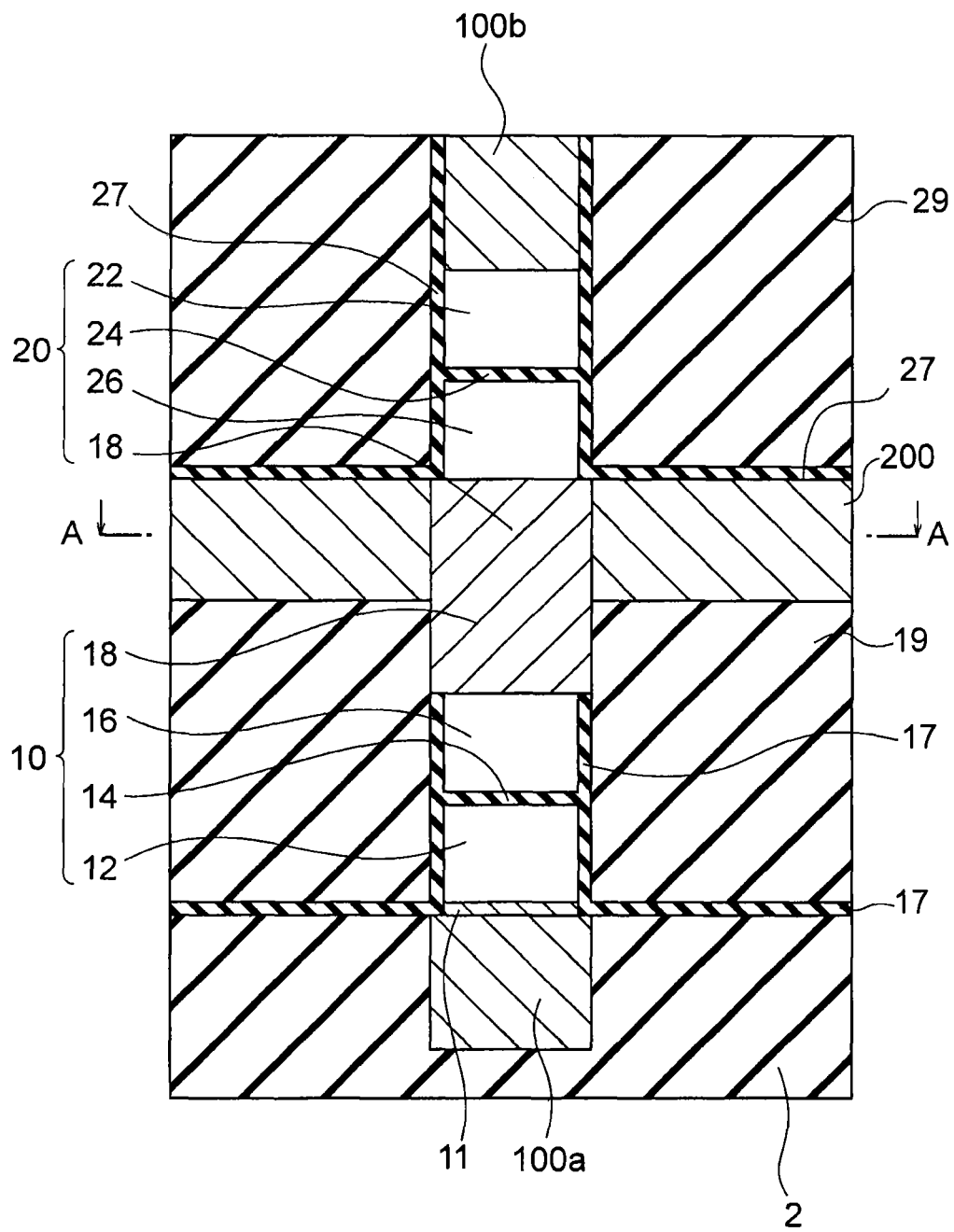
FIG. 1 is a cross-sectional view of a variable resistance memory according to a first embodiment.

A variable resistance memory according to an embodiment includes: a first wiring; a second wiring provided above the first wiring and intersecting with the first wiring; a third wiring provided above the second wiring and intersecting with the second wiring; a first variable resistance element provided in an intersection region between the first wiring and the second wiring, the first variable resistance element including a first variable resistance layer formed on the first wiring, and an ion source electrode provided on the first variable resistance layer and penetrating through the second wiring, the ion source electrode being connected to the second wiring and including metal atoms; and a second variable resistance element provided in an intersection region between the second wiring and the third wiring, the second variable resistance element including a second variable resistance layer formed on the ion source electrode.

First, the problems spotted by the inventors in the course of developing the present invention are described.

As the ion source electrode, a metal such as Ag, Ni, or Co is used. Particularly, Ag is drawing attention as the most effective ion source electrode material, in terms of rectifying properties and operating voltage.

However, those metals, including Ag, have some problems in actual manufacturing processes.

1) Difficulty in Processing

RIE (Reactive Ion Etching) is used in patterning of ion source electrodes. However, the steam pressures of the above metals are low. Therefore, reactivity is not utilized in processing. Instead, high-energy ions are emitted onto those metals, and the momentum of the ions is given to the metal atoms. Mechanical etching needs to be performed on the metals in this manner.

2) Ag Agglomeration

To avoid the problem described in 1), a metal electrode with the smallest possible film thickness needs to be used. However, a thin Ag film is characteristically agglomerated by movement of atoms, and therefore, it is difficult to form a thin film. The experiments we conducted confirmed that the morphology was poor when the film thickness was 20 nm or smaller, and a spherical shape was formed due to agglomeration when the film thickness was even smaller.

3) Sequential Structure and Reversed Structure

In a cross-point type variable resistance memory, a metal wiring is shared between upper and lower memory cells, so as to improve integration. Therefore, a first memory cell formed below a certain metal wiring and a second memory cell formed on the metal wiring need to have stack structures that are plane-symmetrical with respect to the metal wiring. For example, the first memory cell has a sequential structure in which an ion source electrode is formed on a variable resistance layer in sequential order, and the second memory cell has a reversed structure in which a variable resistance layer is formed on an ion source electrode. In terms of patterning, RIE on Ag (the ion source electrode) with a high degree of difficulty needs to be performed once in each of a sequential structure and a reversed structure, where patterning is performed on a stack structure including the pair of the sequential structure and the reversed structure. In terms of agglomeration, Ag agglomeration might be accelerated by the heat history during the process of layer formation, since an amorphous layer (the variable resistance layer) is formed after an Ag layer (the ion electrode) is deposited in the memory cell having the reversed structure.

The following is a description of embodiments, with reference to the accompanying drawings.

(First Embodiment)

Figure 2:
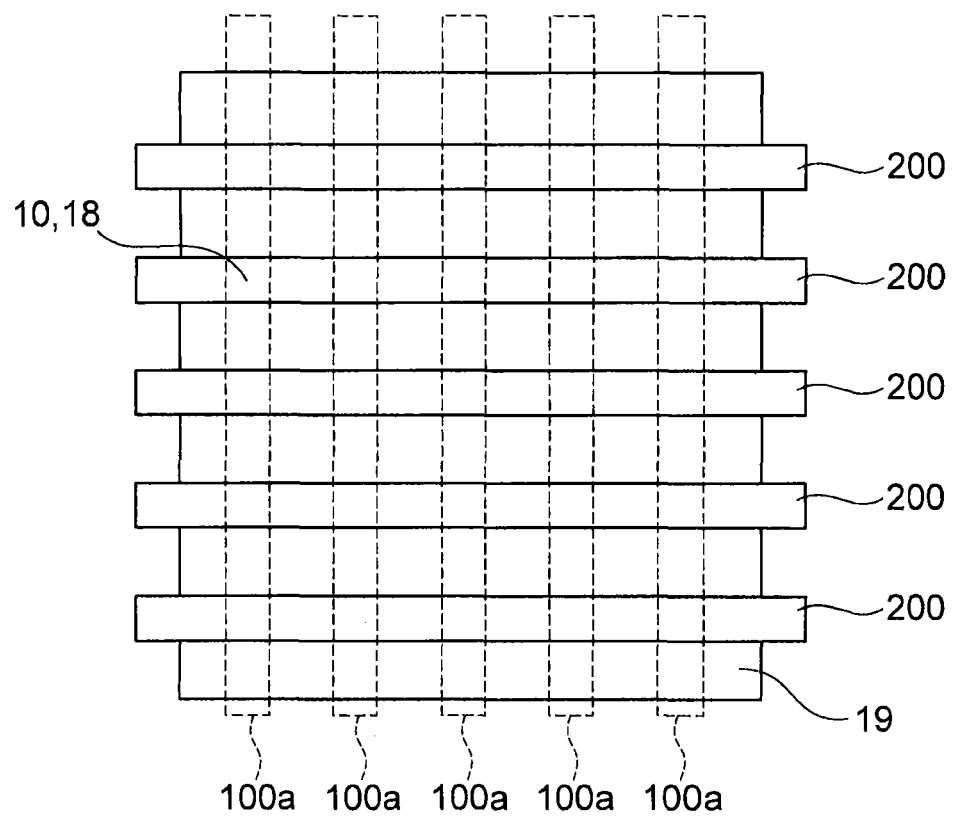
FIG. 2 is a cross-sectional view of the variable resistance memory, taken along the section line A-A of FIG. 1.

Referring to FIGS. 1 and 2, a resistance-change memory according to a first embodiment is described. FIG. 1 is a cross-sectional view of the variable resistance memory according to the first embodiment. FIG. 2 is a cross-sectional view of the variable resistance memory, taken along the section line A-A of FIG. 1.

The variable resistance memory of the first embodiment is a cross-point type variable resistance memory. In this variable resistance memory, first memory cells (variable resistance elements) 10 are provided between first wirings 100a and second wirings 200 that intersect with the first wirings 100a, and second memory cells (variable resistance elements) 20 are provided between the second wirings 200 and third wirings 100b that intersect with the second wirings 200. It should be noted that, in the first embodiment, the third wirings 100b are located above the first wirings 100a, and are arranged parallel to the first wirings 100a. The first wirings 100a have upper faces exposed through an insulating film 2.

The first memory cells 10 are provided in the intersection regions between the first wirings 100a and the second wirings 200. Each of the first memory cells 10 includes: a polysilicon layer 12 that is formed on the corresponding first wiring 100a and is doped with an n-type impurity; an insulating layer 14 that is formed on the polysilicon layer 12 and is made of SiN, for example; a variable resistance layer 16 that is formed on the insulating layer 14 and is made of amorphous silicon; and an ion source electrode 18 that is formed on the variable resistance layer 16 and is made of Ag, for example. It should be noted that a barrier metal 11 may be provided between the first wiring 100a and the polysilicon layer 12. The ion source electrode 18 penetrates through the second wiring 200 made of a different metal from the metal serving as the ion source, and is connected to the second wiring 200. In this first memory cell 10, a liner 17 that has a film thickness of 1.5 nm and is made of SiN is provided on each side face of the polysilicon layer 12 and the variable resistance layer 16. This liner 17 is also formed on the upper face of the insulating film 2. Also, an interlayer insulating film 19 made of $SiO_2$, for example, is formed on each side of the first memory cell 10.

Meanwhile, the second memory cells 20 are provided in the intersection regions between the second wirings 200 and the first wirings 100a. Each of the second memory cells 20 includes: the ion source electrode 18 made of Ag, for example; a variable resistance layer 26 that is formed on the ion source electrode 18 and is made of amorphous silicon; an insulating layer 24 that is formed on the variable resistance layer 26 and is made of SiN, for example; and a polysilicon layer 22 that is formed on the insulating layer 24 and is doped with an n-type impurity, for example. That is, the corresponding first memory cell 10 and the second memory cell 20 share the ion source electrode 18. The corresponding third wiring 100b is provided on the polysilicon layer 22. That is, the second memory cell 20 is formed by stacking the ion source electrode 18, the variable resistance layer 26, the insulating layer 24, the polysilicon layer 22, and the third wiring 100b in this order, while the first memory cell 10 is formed by stacking the first wiring 100a, the polysilicon layer 12, the insulating layer 14, the variable resistance layer 16, and the ion source electrode 18 in this order. Accordingly, the layers forming the stack structure of the first memory cell 10 is in the reversed order of the order of the layers forming the stack structure of the second memory cell 20. In this second memory cell 20, a liner 27 that has a film thickness of 1.5 nm and is made of SiN, for example, is provided on each side face of the variable resistance layer 26 and the polysilicon layer 22. This liner 27 is also provided on part of each side of the third wiring 100b. Also, an interlayer insulating film 29 made of $SiO_2$, for example, is formed on each side of the second memory cell 20.

In the variable resistance memory of the first embodiment having the above structure, when a first wiring 100a is grounded, and a positive voltage is applied to a second wiring 200 as opposed to the first wiring 100a, Ag ions are emitted from the ion source electrode 18. The Ag ions move toward the first wiring 100a, and a filament formed by the Ag ions is formed in the variable resistance layer 16, so that the filament reaches the insulating layer 14. By virtue of this filament, the first wiring 100a is electrically connected to the second wiring 200 via the first memory cell 10, and the first memory cell 10 is put into a low-resistance state (hereinafter also referred to as a set state). Likewise, when a third wiring 100b is grounded, and a positive voltage is applied to a second wiring 200 as opposed to the third wiring 100b, a filament formed by Ag ions is formed in the variable resistance layer 26, so that the filament reaches the insulating layer 24. By virtue of this filament, the third wiring 100b is electrically connected to the second wiring 200 via the second memory cell 20, and the second memory cell 20 is put into a low-resistance state (a set state). The Ag ions might be stopped by the insulating layers 14 and 24, for example. At that point, the insulating layer 14 of the first memory cell 10 and the insulating layer 24 of the second memory cell 20 each need to be made to have a film thickness such that charge carriers can tunnel therethrough, or have a film thickness of several nanometers, for example. Also, in another example, depending on the applied field and the film thicknesses of the insulating layer 14 and the insulating layer 24, the Ag ions might partially or completely enter the inside of the insulating layer 14 or the insulating layer 24. In such a case, the resistance of each memory cell can be made lower than that in the above described example. In this manner, the film thickness of the insulating layer 14 or the insulating layer 24 serves as one of the parameters for controlling the resistance value of each memory cell, like the applied voltage. Other than that, the insulating layer 14 and the insulating layer 24 serve to prevent direct contact between the amorphous silicon forming a variable resistance layer and the polysilicon doped with an impurity, and prevent a decrease in resistance of the variable resistance layer due to polycrystallization (grain coarsening) of the amorphous silicon and diffusion of the impurity in the polysilicon into the amorphous Si layer.

When a first memory cell 10 is in a set state, a positive voltage is applied to the corresponding first wiring 100a, and the corresponding second wiring 200 is grounded. As a result, the Ag atoms forming a filament are partially ionized, and move toward the ion source electrode 18. The filament connecting the electrodes becomes discontinuous, and the first memory cell 10 transits to a high-resistance state (hereinafter also referred to as a reset state). Likewise, when a second memory cell 20 is in a set state, a positive voltage is applied to the corresponding third wiring 100b, and the corresponding second wiring 200 is grounded. The second memory cell 20 then transits to a reset state.

In the variable resistance memory of the first embodiment having the above structure, the first memory cells 10 and the second memory cells 20 penetrate through the second wirings 200, and share the ion source electrodes 18 connected to the second wirings 200. Accordingly, the film thickness of each ion source electrode 18 can be made greater, and agglomeration of the metal forming the ion source electrodes 18 can be prevented.

In the above description, the polysilicon layers 12 and 22 are n-type polysilicon layers. However, the polysilicon layers 12 and 22 may be p-type polysilicon layers. Alternatively, the polysilicon layers 12 and 22 can be made of a metal that is not easily ionized, such as W (tungsten) or Ti (titanium).

Figure 3:
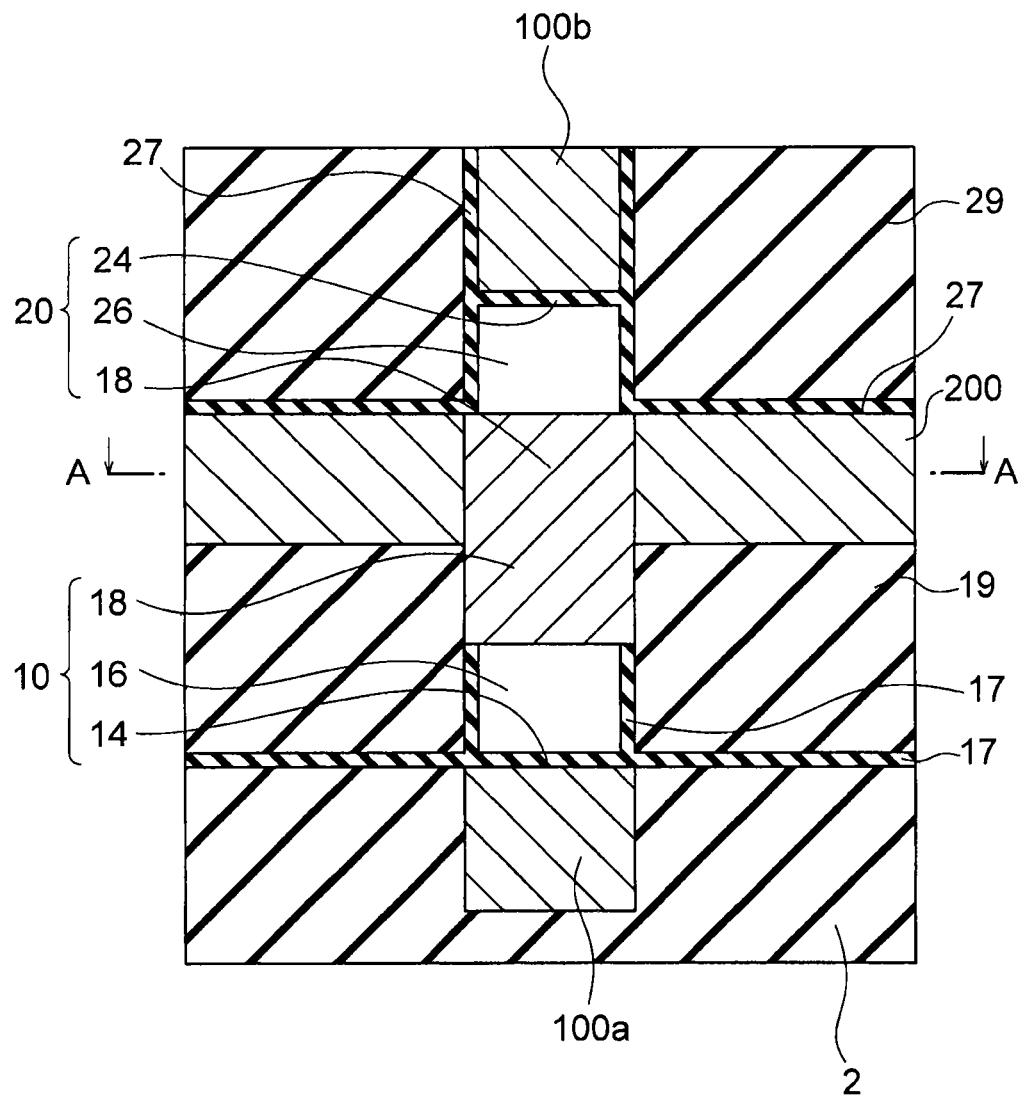
FIG. 3 is a cross-sectional view of a variable resistance memory according to a first modification of the first embodiment.
Figure 4:
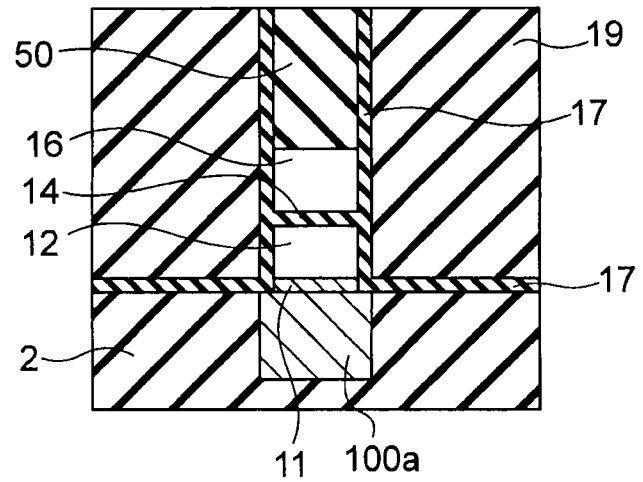
FIGS. 4(a) and 4(b) are cross-sectional views showing procedures for manufacturing the variable resistance memory according to the first embodiment.
Figure 4:
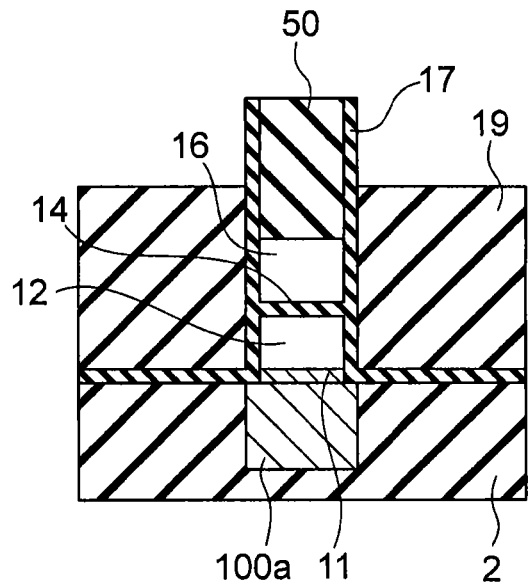
Figure 5:
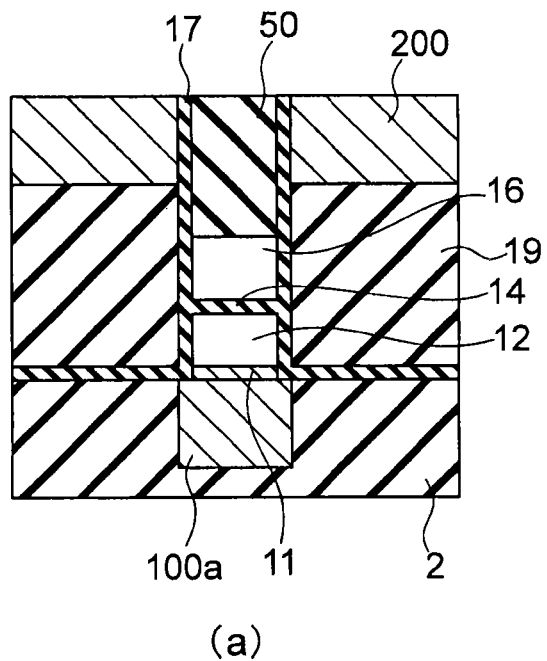
FIGS. 5(a) and 5(b) are cross-sectional views showing procedures for manufacturing the variable resistance memory according to the first embodiment.
Figure 5:
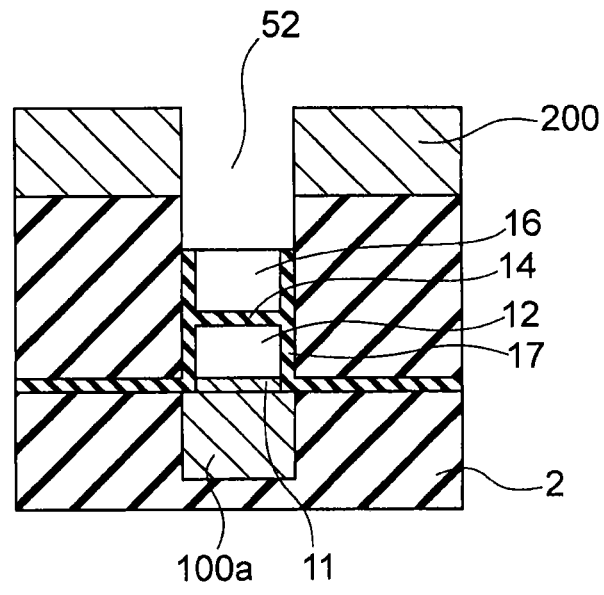
Figure 6:
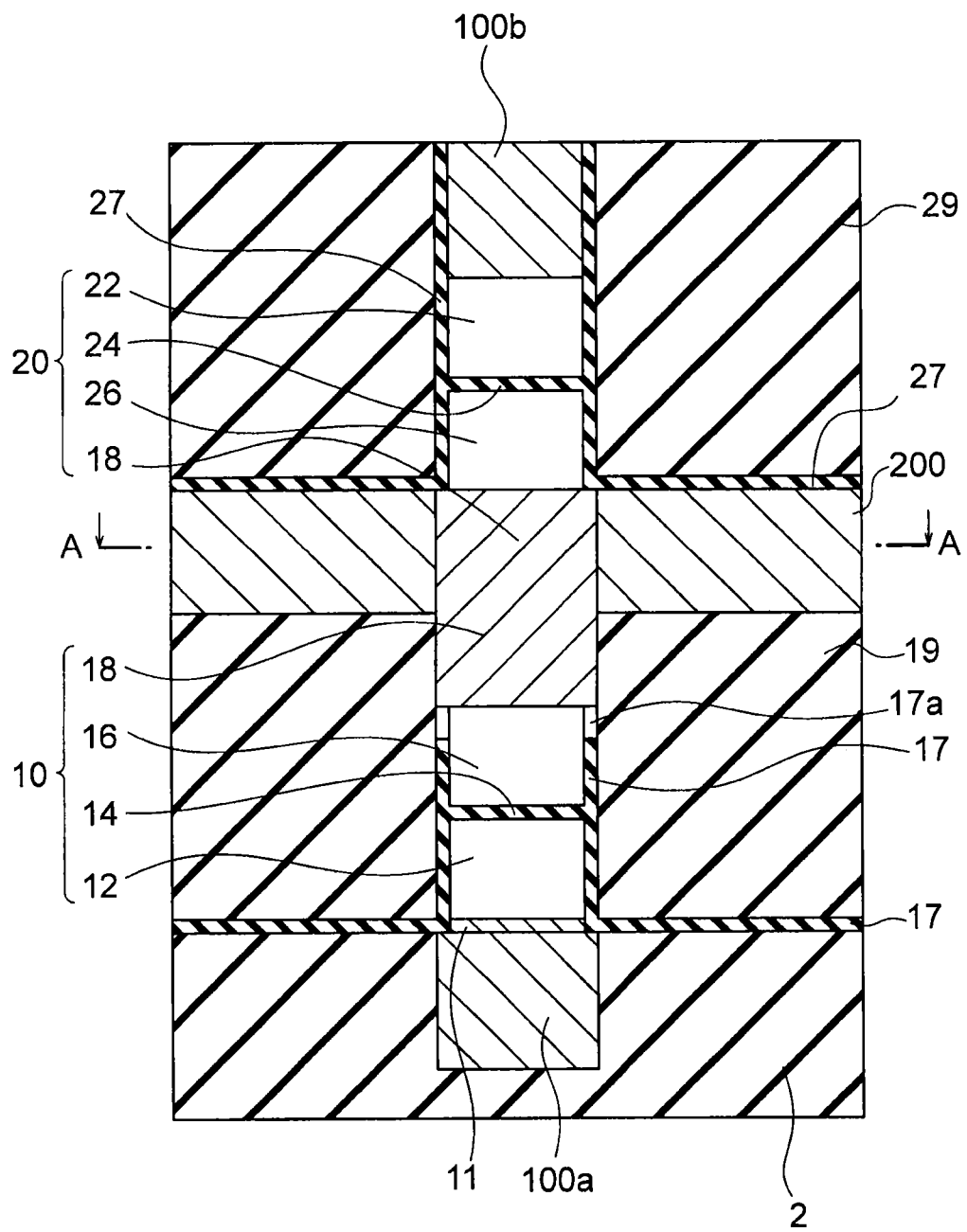
FIG. 6 is a cross-sectional view of a variable resistance memory according to a second modification of the first embodiment.
Figure 7:
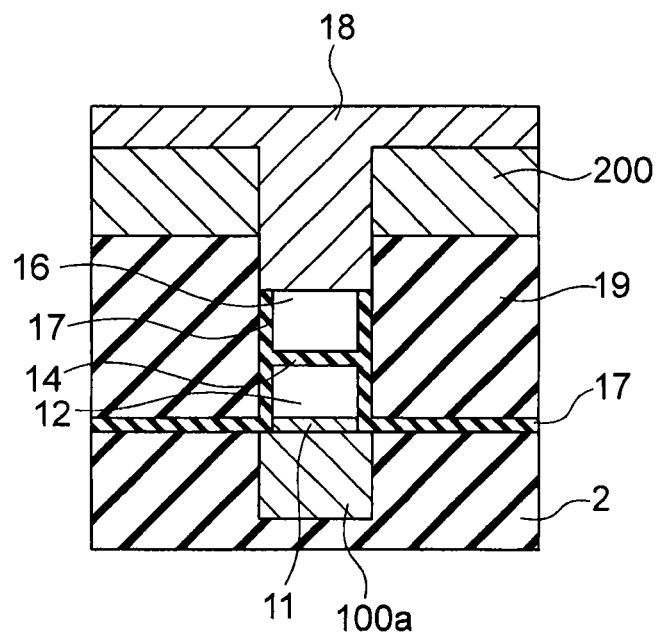
FIGS. 7(a) and 7(b) are cross-sectional views showing procedures for manufacturing the variable resistance memory according to the first embodiment.
Figure 7:
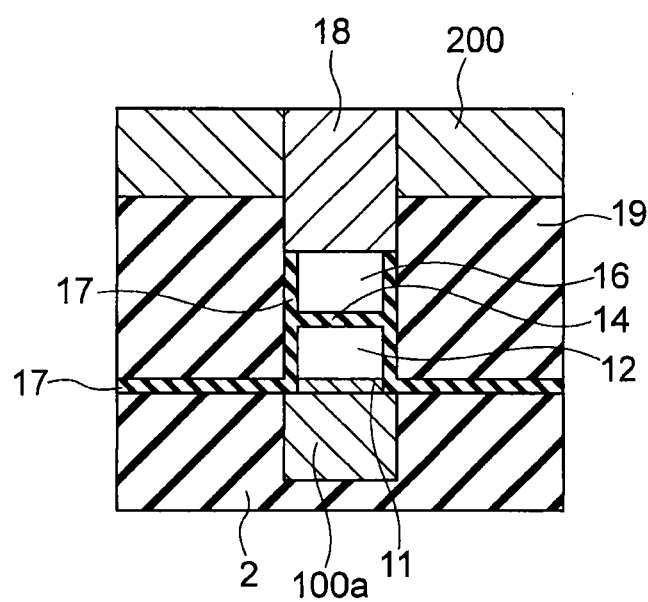
Figure 8:
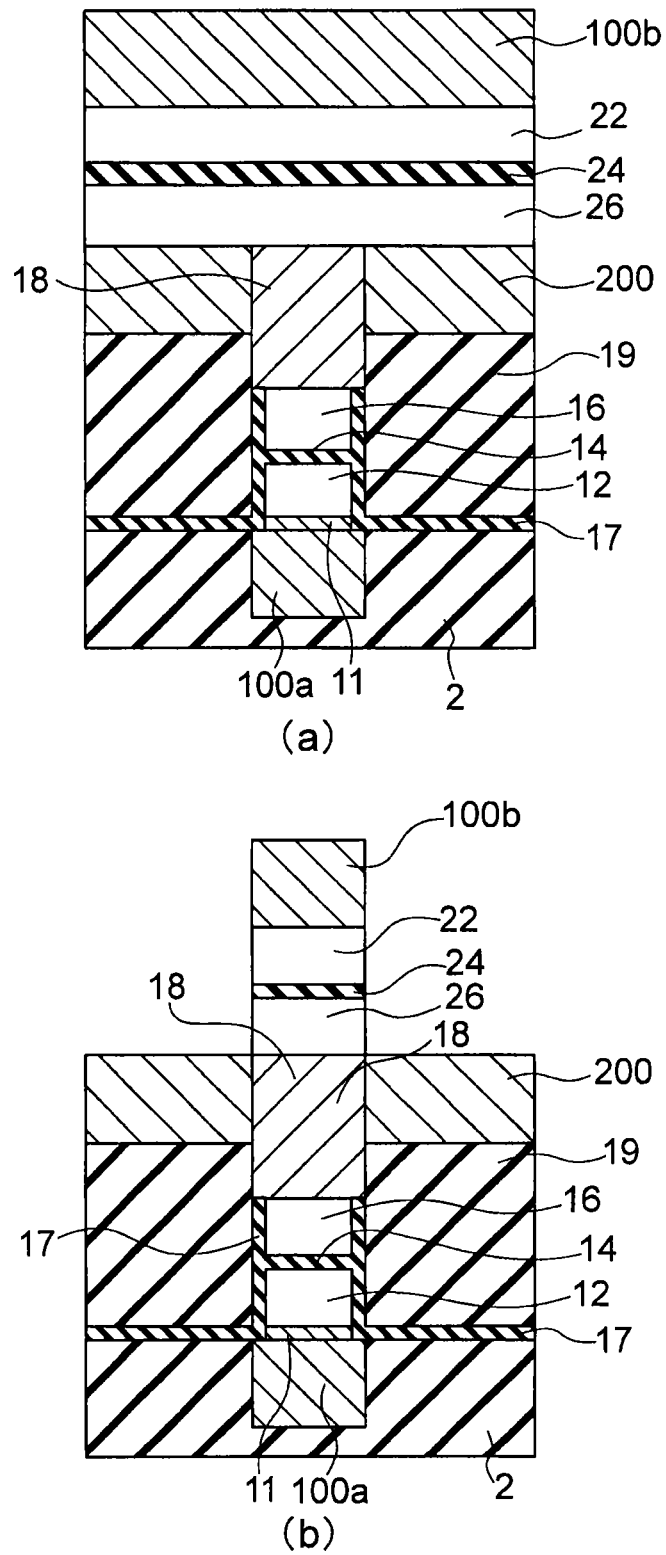
FIGS. 8(a) and 8(b) are cross-sectional views showing procedures for manufacturing the variable resistance memory according to the first embodiment.

As in a variable resistance memory according to a first modification illustrated in FIG. 3, the polysilicon layers 12 and 22 can be omitted, and the variable resistance layers 16 and 26, and the insulating layers 14 and 24 can be in direct contact with the first wirings 100a and the third wirings 100b. In that case, the heights of the first and second memory cells 10 and 20 become smaller, and the later described procedure for patterning the stack structures is simplified.

Although the variable resistance layers 16 are made of amorphous silicon in the above description, the variable resistance layers 16 may be made of a silicon oxide, a silicon oxynitride, or a metal oxide such as a hafnium oxide or an aluminum oxide.

Referring now to FIGS. 4(a) through 8(b), a method of manufacturing a variable resistance memory of the first embodiment is described.

First, as shown in FIG. 4(a), grooves for the first wirings 100a are formed in the insulating film 2, and a first wiring material such as W (tungsten) is deposited in each of those grooves by CVD (Chemical Vapor Deposition) or the like. After that, the first wiring material is buried by a flattening technique such as CMP (Chemical Mechanical Polishing), to form the first wirings 100a. The polysilicon layer 12 doped with an n-type impurity, the SiN layer 14, the amorphous silicon layer 16, and a SiN layer 50 are then sequentially stacked to form a film stack that covers each first wiring 100a. The barrier metal 11 may be provided between the first wiring 100a and the polysilicon layer 12. By using a known lithography technique, patterning is performed on the film stack, to form a stack structure consisting of the polysilicon layer 12, the SiN layer 14, the amorphous silicon layer 16, and the SiN layer 50 on the first wiring 100a. After that, by using ALD (Atomic Layer Deposition), for example, the liner 17 made of SiN is formed on each side face of the stack structure. At this point, the SiN layer 17 is also formed on the upper face of the insulating film 2. By using CVD, for example, $SiO_2$ is deposited to cover the stack structure, and the interlayer insulating film 19 is formed. After that, the interlayer insulating film 19 is flattened by CMP, for example, to expose the upper face of the stack structure or the upper face of the SiN layer 50 (FIG. 4(a)).

As shown in FIG. 4(b), part of the interlayer insulating film 19 is shaved off by etching, and the upper portion of the SiN layer 50 is exposed so that the upper face of the interlayer insulating film 19 is located in a higher position than the upper face of the amorphous silicon layer 16.

As shown in FIG. 5(a), W to be the second wirings 200 is deposited by CVD, for example, and flattening is performed by CMP, to expose the upper faces of the liner 17 and the SiN layer 50. Patterning is then performed on the W layer, and the second wirings 200 are formed so that the SiN layer 50 and the liner 17 penetrate through the patterned W layer. After that, the SiN layer 50 is removed by wet etching or the like. An opening 52 is then formed in a place the SiN layer 50 exists, as shown in FIG. 5(b). Since the liner 17 is also made of SiN, the portions of the liner 17 located on the sides of the SiN layer 50 are also removed at this point. However, the portions of the liner 17 located on the sides of the amorphous silicon layer 16 are left. Depending on the etching time, part of the portions of the liner 17 located on the sides of the amorphous silicon layer 16 might be removed. In such a case, the removed portions turn into voids. For example, as in a second modification of the first embodiment illustrated in FIG. 6, a void 17a is formed at part of each side of the amorphous silicon layer 16 after the formation of the second wirings 200.

As shown in FIG. 7(a), the Ag layer 18 that is an ion source electrode material is deposited to fill the opening 52. At this point, the Ag layer 18 is also formed on the second wirings 200. After that, by using CMP, RIE, or wet etching, the portions of the Ag layer 18 located on the second wirings 200 are removed, and the Ag layer 18 is buried in the opening 52 (FIG. 7(b)).

As shown in FIG. 8(a), the amorphous silicon layer 26, the SiN layer 24, the polysilicon layer 22 doped with an n-type impurity, for example, and a W layer to be the third wirings 100b are sequentially formed to cover the Ag layer 18 buried in the opening 52 and the second wirings 200. In this manner, a film stack is formed. Patterning is then performed on this film stack by using a known lithography technique, and a stack structure consisting of the amorphous silicon layer 26, the SiN layer 24, the polysilicon layer 22, and the W layer 100b is formed on the Ag layer 18 (FIG. 8(b)).

The liner 27 made of SiN, for example, is then formed on each side face of the stack structure (FIG. 1). After that, the interlayer insulating film 29 made of $SiO_2$, for example, is deposited by using CVD, for example. The interlayer insulating film 29 is then flattened by using CMP, to complete the variable resistance memory of the first embodiment.

In the above described manufacturing method, etching is performed only once for the ion source electrode 18, to form the stack structures of the first memory cells 10 and the second memory cells 20. In a conventional structure, on the other hand, etching needs to be performed twice. That is, etching needs to be performed once for the first memory cells that are sequential structures, and etching needs to be performed once for the second memory cells that are reversed structures. Accordingly, the number of procedures can be reduced in this embodiment. Also, even if the amorphous silicon layer 26 of each second memory cell is formed after the ion source electrode 18 made of Ag is deposited, acceleration of Ag agglomeration due to the heat history during the process for forming the amorphous silicon layer 26 can be prevented by the great film thickness of the ion source electrode 18.

(Second Embodiment)

Figure 9:
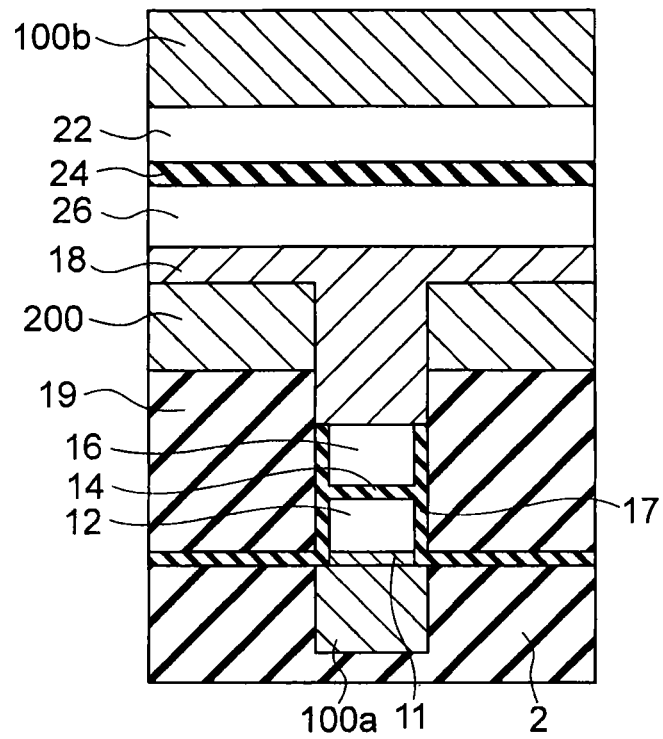
FIGS. 9(a) and 9(b) are cross-sectional views showing procedures for manufacturing a variable resistance memory according to a second embodiment.
Figure 9:
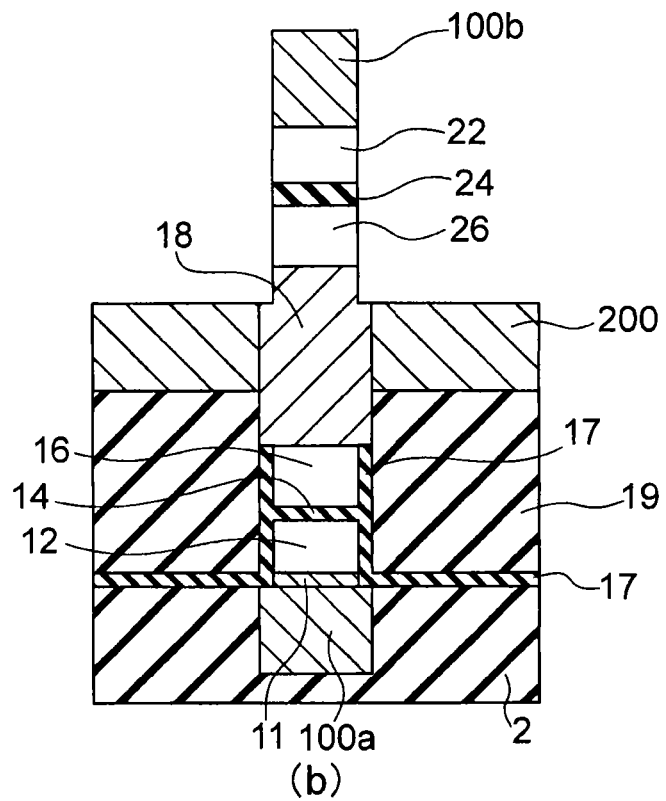
Figure 10:
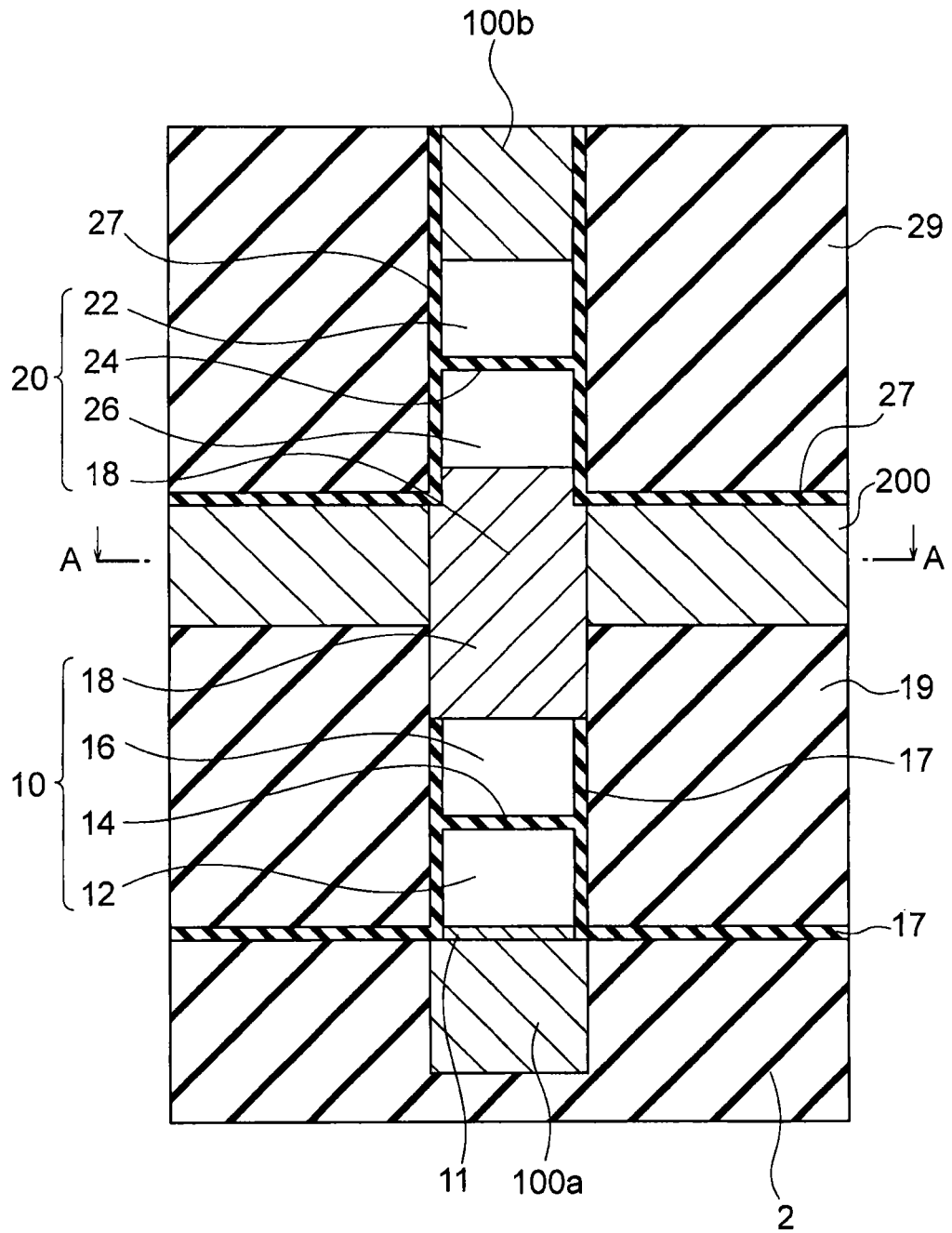
FIG. 10 is a cross-sectional view of the variable resistance memory according to the second embodiment.
Figure 11:
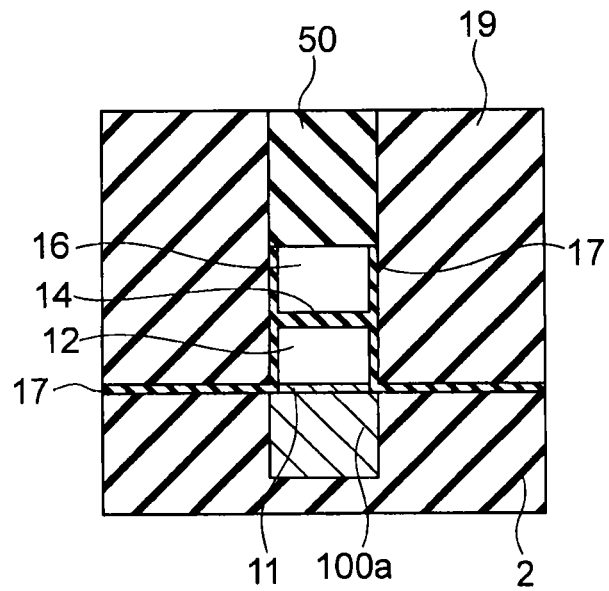
FIGS. 11(a) and 11(b) are cross-sectional views showing procedures for manufacturing a variable resistance memory according to a third embodiment.
Figure 11:
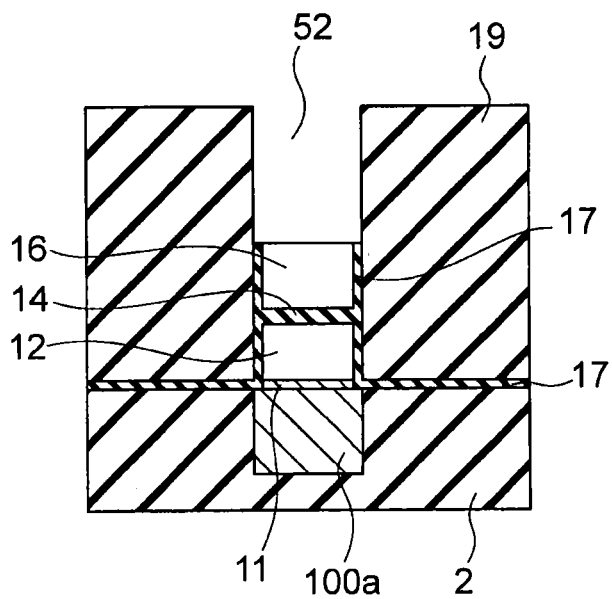
Figure 12:
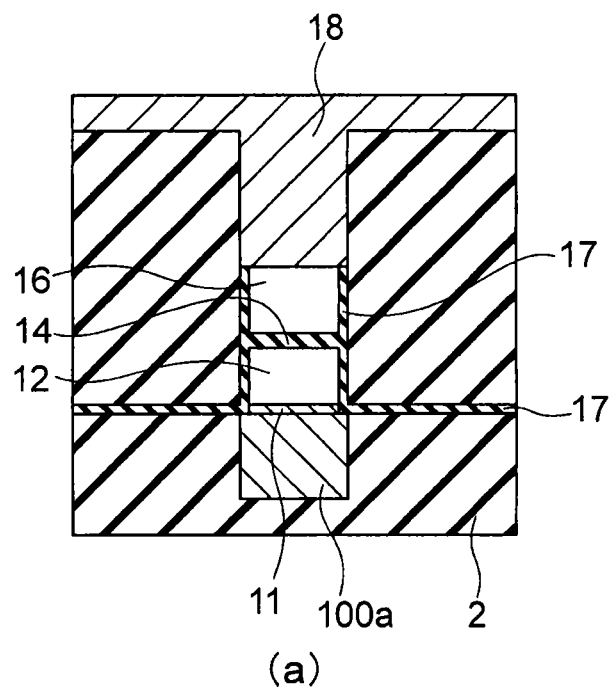
FIGS. 12(a) and 12(b) are cross-sectional views showing procedures for manufacturing the variable resistance memory according to the third embodiment.
Figure 12:
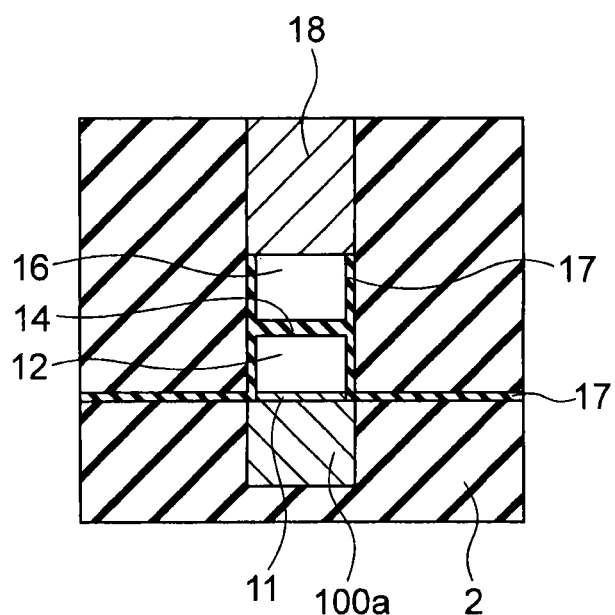
Figure 13:
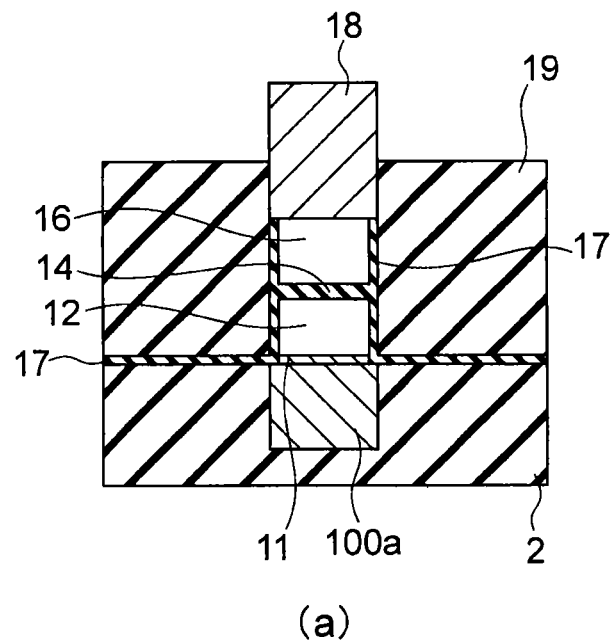
FIGS. 13(a) and 13(b) are cross-sectional views showing procedures for manufacturing the variable resistance memory according to the third embodiment.
Figure 13:
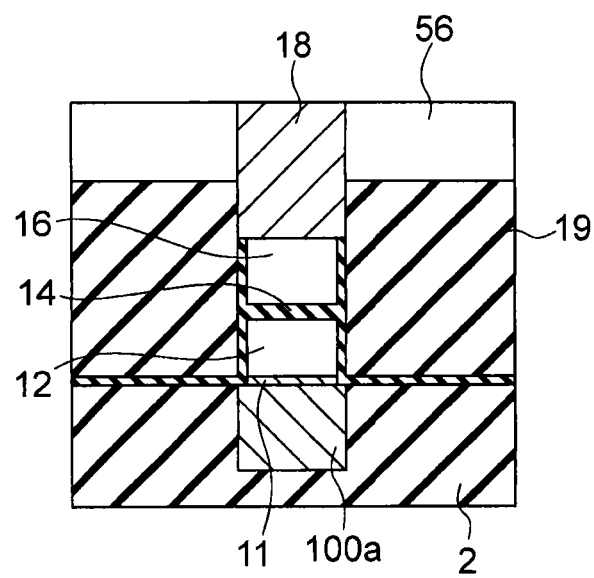
Figure 14:
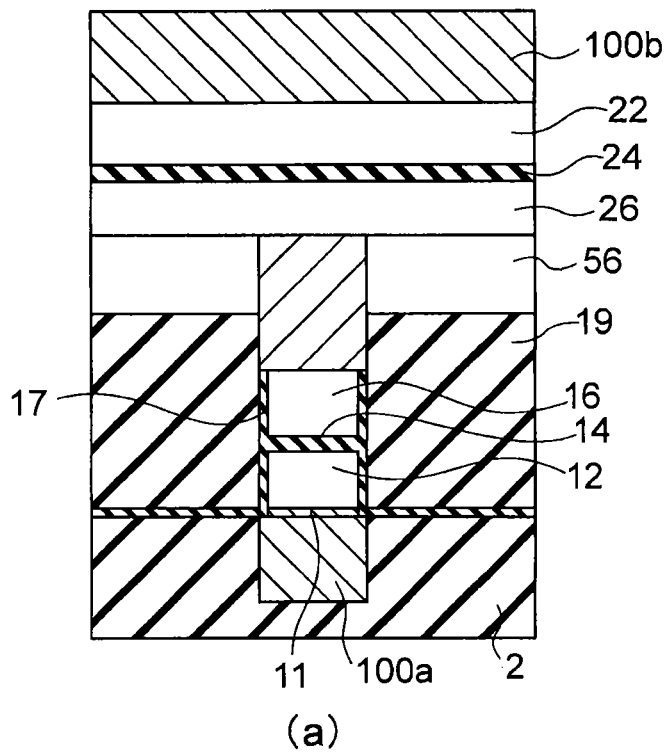
FIGS. 14(a) and 14(b) are cross-sectional views showing procedures for manufacturing the variable resistance memory according to the third embodiment.
Figure 14:
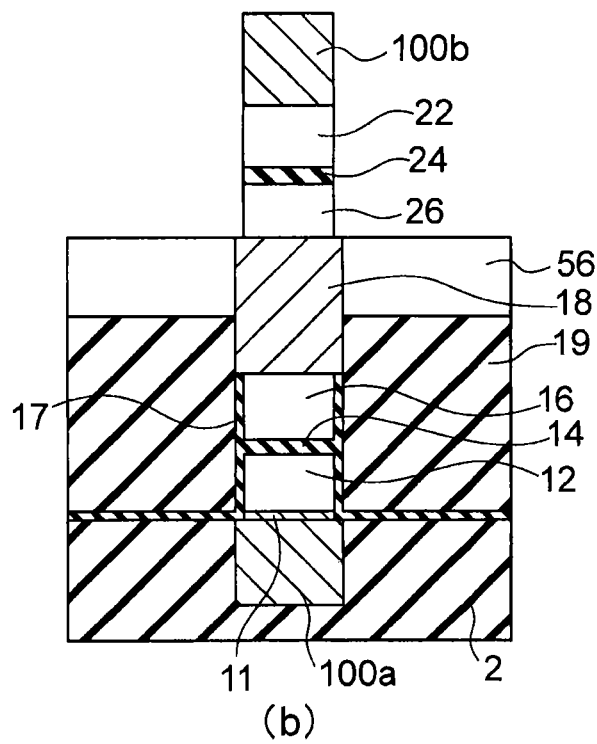

Referring now to FIGS. 9(a) through 10, a method of manufacturing a variable resistance memory according to a second embodiment is described. FIGS. 9(a) and 9(b) are cross-sectional views illustrating procedures for manufacturing the variable resistance memory of the second embodiment. FIG. 10 is a cross-sectional view of the variable resistance memory of the second embodiment. The same procedures as those in the manufacturing method described in the first embodiment are carried out until the opening 52 shown in FIG. 5(b) is formed. After that, as shown in FIG. 9(a), the Ag layer 18 to be the ion source electrode is deposited to fill the opening 52. The amorphous silicon layer 26, the SiN layer 24, the polysilicon layer 22, and a W layer to be the third wirings 100b are then sequentially formed to cover the Ag layer 18, and a film stack is formed. After that, patterning is performed on the film stack by using a known lithography technique, and a stack structure consisting of the amorphous silicon layer 26, the SiN layer 24, the polysilicon layer 22, and the W layer 100b is formed on the Ag layer 18 (FIG. 9(b)).

The liner 27 made of SiN, for example, is then formed on each side face of the stack structure (FIG. 10). After that, the interlayer insulating film 29 made of $SiO_2$, for example, is deposited by using CVD, for example. The interlayer insulating film 29 is then flattened by using CMP, to complete the variable resistance memory manufactured by the manufacturing method according to the second embodiment. A cross-sectional surface of the variable resistance memory of the second embodiment manufactured as described above is shown in FIG. 10.

In the variable resistance memory manufactured by the manufacturing method according to the second embodiment, etching for the ion source electrode 18 is performed only once, as in the first embodiment. Accordingly, the number of etching procedures for the ion source electrodes can be reduced by one, compared with the number of etching procedures required in conventional structures. Also, even if the amorphous silicon layer 26 of each second memory cell is formed after the ion source electrode 18 made of Ag is deposited, acceleration of Ag agglomeration due to the heat history during the process for forming the amorphous silicon layer 26 can be prevented by the great film thickness of the ion source electrode 18.

(Third Embodiment)

Referring now to FIGS. 11(a) through 14(b), a method of manufacturing a variable resistance memory according to a third embodiment is described. FIGS. 11(a) through 14(b) are cross-sectional views illustrating procedures for manufacturing the variable resistance memory according to the third embodiment. In the third embodiment, graphene that is drawing attention as the next-generation wiring material is used as the second wirings 200.

The same procedures as those in the manufacturing method described in the first embodiment are carried out until the interlayer insulating film 19 made of $SiO_2$ shown in FIG. 4(a) is formed (FIG. 11(a)). After that, the SiN layer 50 is removed by wet etching, as shown in FIG. 11(b). An opening 52 is then formed in a place the SiN layer 50 exists. Since the liner 17 is also made of SiN, the portions of the liner 17 located on the sides of the SiN layer 50 are also removed at this point. However, the portions of the liner 17 located on the sides of the amorphous silicon layer 16 are left. Depending on the etching time, part of the portions of the liner 17 located on the sides of the amorphous silicon layer 16 might be removed.

As shown in FIG. 12(a), the Ag layer 18 that is an ion source electrode material is deposited to fill the opening 52. At this point, the Ag layer 18 is also formed on the interlayer insulating film 19. After that, by using CMP, RIE, or wet etching, the portions of the Ag layer 18 located on the interlayer insulating film 19 are removed, and the Ag layer 18 is buried in the opening 52 (FIG. 12(b)).

A part of the interlayer insulating film 19 is then shaved off by etching, so that the upper face of the interlayer insulating film 19 is located in a higher position than the upper face of the amorphous silicon layer 16 (FIG. 13(a)). At this point, an upper portion of the Ag layer 18 is exposed. A graphene layer 56 is then grown in the horizontal direction, with the side face portions of the Ag layer 18 being the growth starting portions. If unnecessary graphene portions are grown, the graphene layer 56 is flattened by using CMP or the like. At this point, the upper face of the Ag layer 18 is exposed (FIG. 13(b)).

As shown in FIG. 14(a), the amorphous silicon layer 26, the SiN layer 24, the polysilicon layer 22 doped with an n-type impurity, for example, and a W layer to be the third wirings 100b are then sequentially formed to cover the graphene layer 56 and the Ag layer 18, and a film stack is formed. After that, patterning is performed on the film stack by using a known lithography technique, and a stack structure consisting of the amorphous silicon layer 26, the SiN layer 24, the polysilicon layer 22, and the W layer 100b is formed on the Ag layer 18 (FIG. 14(b)).

The liner 27 made of SiN, for example, is then formed on each side face of the stack structure. After that, the interlayer insulating film 29 made of $SiO_2$, for example, is deposited by using CVD, for example. The interlayer insulating film 29 is then flattened by using CMP, to complete the variable resistance memory of the third embodiment.

In the above described manufacturing method, etching is performed only once for the ion source electrode 18, to form the stack structures of the first memory cells 10 and the second memory cells 20. Accordingly, the number of etching procedures for the ion source electrodes can be reduced by one, compared with the number of etching procedures required in conventional structures. Also, even if the amorphous silicon layer 26 of each second memory cell is formed after the ion source electrode 18 made of Ag is formed, acceleration of Ag agglomeration due to the heat history during the process for forming the amorphous silicon layer 26 can be prevented by the great film thickness of the ion source electrode 18.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A variable resistance memory comprising:
   a first wiring;
   a second wiring provided above the first wiring and intersecting with the first wiring;
   a third wiring provided above the second wiring and intersecting with the second wiring;
   a first variable resistance element provided in an intersection region between the first wiring and the second wiring, the first variable resistance element including a first variable resistance layer formed on the first wiring, and an ion source electrode provided on the first variable resistance layer and penetrating through the second wiring, the ion source electrode being directly connected to the second wiring; and a second variable resistance element provided in an intersection region between the second wiring and the third wiring, the second variable resistance element including a second variable resistance layer formed on the ion source electrode, the ion source electrode being a common ion source electrode for the first and second variable resistance elements.

2. The variable resistance memory according to claim 1, wherein the first variable resistance element includes a first polysilicon layer provided between the first wiring and the first variable resistance layer, and a first insulating layer provided between the first polysilicon layer and the first variable resistance layer, the first polysilicon layer being doped with an impurity, and the second variable resistance element includes a second polysilicon layer provided between the second variable resistance layer and the third wiring, and a second insulating layer provided between the second polysilicon layer and the second variable resistance layer, the second polysilicon layer being doped with an impurity.

3. The variable resistance memory according to claim 1, wherein a first interlayer insulating film is formed on side faces of the first variable resistance element, and voids are formed between upper side faces of the first variable resistance layer and the first interlayer insulating film.

4. The variable resistance memory according to claim 1, wherein first side walls of insulating material are formed on side faces of the first variable resistance element.

5. The variable resistance memory according to claim 4, wherein a sum of a width of the first variable resistance element and widths of first side walls is substantially equal to a width of the ion source electrode.

6. The variable resistance memory according to claim 4, wherein a width of the first wiring is larger than that of the first variable resistance element.

7. The variable resistance memory according to claim 4, wherein the ion source electrode includes a metal atom and the metal atom is any one of elements selected from a group consisting of Ag, Ni, and Co.

8. The variable resistance memory according to claim 7, wherein the metal atom is Ag.

9. The variable resistance memory according to claim 1, wherein second sidewalls of insulating material are formed on side faces of the second variable resistance element and extend on the second wiring.

10. A variable resistance memory comprising:
a first wiring;
a second wiring provided above the first wiring and intersecting with the first wiring;
a third wiring provided above the second wiring and intersecting with the second wiring;
a first variable resistance element provided in an intersection region between the first wiring and the second wiring, the first variable resistance element including a first variable resistance layer formed on the first wiring, and an ion source electrode provided on the first variable resistance layer and penetrating through the second wiring, the ion source electrode being connected to the second wiring; and
a second variable resistance element provided in an intersection region between the second wiring and the third wiring, the second variable resistance element including a second variable resistance layer formed on the ion source electrode,
wherein a first interlayer insulating film is formed on side faces of the first variable resistance element, and voids are formed between upper side faces of the first variable resistance layer and the first interlayer insulating film.

* * * * *